(12) United States Patent
Huang et al.

(10) Patent No.: US 12,002,749 B2
(45) Date of Patent: Jun. 4, 2024

(54) BARRIER AND AIR-GAP SCHEME FOR HIGH PERFORMANCE INTERCONNECTS

(71) Applicant: Taiwan Semiconductor Manufacturing Company, Ltd., Hsinchu (TW)

(72) Inventors: Hsin-Yen Huang, New Taipei (TW); Ting-Ya Lo, Hsinchu (TW); Shao-Kuan Lee, Kaohsiung (TW); Chi-Lin Teng, Taichung (TW); Cheng-Chin Lee, Taipei (TW); Shau-Lin Shue, Hsinchu (TW); Hsiao-Kang Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 157 days.

(21) Appl. No.: 17/412,403

(22) Filed: Aug. 26, 2021

(65) Prior Publication Data
US 2023/0068892 A1 Mar. 2, 2023

(51) Int. Cl.
*H01L 23/522* (2006.01)
*H01L 21/768* (2006.01)

(52) U.S. Cl.
CPC .... *H01L 23/5226* (2013.01); *H01L 21/76831* (2013.01); *H01L 21/76832* (2013.01)

(58) Field of Classification Search
CPC .......... H01L 21/7682; H01L 21/76831; H01L 21/76832; H01L 21/76877; H01L 21/76897; H01L 21/764; H01L 23/5226; H01L 23/53295; H01L 29/0649
See application file for complete search history.

(56) References Cited

U.S. PATENT DOCUMENTS

| | | | | |
|---|---|---|---|---|
| 9,368,362 | B2 * | 6/2016 | Rha | H01L 21/76826 |
| 10,043,706 | B2 * | 8/2018 | Ting | H01L 23/5283 |
| 10,665,546 | B1 * | 5/2020 | Lin | H01L 21/76826 |
| 11,183,421 | B2 * | 11/2021 | Hsieh | H01L 23/5222 |
| 2009/0309230 | A1 * | 12/2009 | Cui | H01L 23/53238 257/773 |
| 2010/0181678 | A1 * | 7/2010 | Edelstein | H01L 21/76883 430/311 |
| 2012/0319279 | A1 * | 12/2012 | Isobayashi | H01L 23/53238 438/653 |
| 2013/0323930 | A1 * | 12/2013 | Chattopadhyay | H01L 21/76829 156/345.26 |
| 2014/0131880 | A1 * | 5/2014 | Clevenger | H01L 23/4821 257/773 |
| 2020/0185264 | A1 * | 6/2020 | Lin | H01L 21/7682 |
| 2021/0193566 | A1 * | 6/2021 | Lo | H01L 23/5384 |

* cited by examiner

*Primary Examiner* — Jaehwan Oh
*Assistant Examiner* — John M Parker
(74) *Attorney, Agent, or Firm* — Eschweiler & Potashnik, LLC

(57) ABSTRACT

Some embodiments of the present disclosure relate to an integrated chip, including a semiconductor substrate and a dielectric layer disposed over the semiconductor substrate. A pair of metal lines are disposed over the dielectric layer and laterally spaced apart from one another by a cavity. A barrier layer structure extends along nearest neighboring sidewalls of the pair of metal lines such that the cavity is defined by inner sidewalls of the barrier layer structure and a top surface of the dielectric layer.

20 Claims, 9 Drawing Sheets

BARRIER AND AIR-GAP SCHEME FOR HIGH PERFORMANCE INTERCONNECTS

BACKGROUND

As dimensions and feature sizes of semiconductor integrated circuits (ICs) are scaled down, the density of the elements forming the ICs is increased and the spacing between elements is reduced. Such spacing reductions are limited by light diffraction of photolithography, mask alignment, isolation and device performance among other factors. As the distance between any two adjacent conductive features decreases, the complexity of fabrication increases and the risk of fabrication errors increases. The operating voltage of ICs do not scale at the same pace as feature sizes decrease, resulting in increasing electric fields inside devices. Capacitance between interconnects and diffusion between layers typically increase, which results in an increase in power consumption and time delay leading to degradation of device performance.

DETAILED DESCRIPTION

Figure 1:
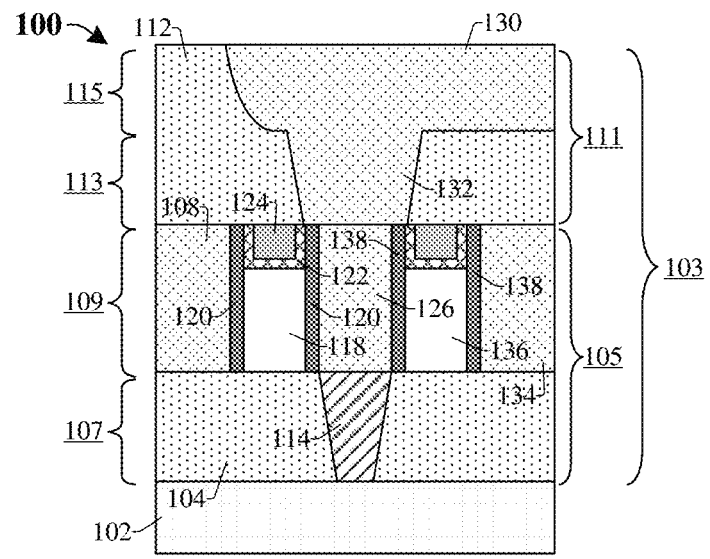
FIG. 1 illustrates a cross-sectional view of an integrated chip in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An IC includes a number of semiconductor devices (e.g., transistors, memory devices, etc.) disposed over and/or within a semiconductor substrate. To achieve a desired circuit configuration, these semiconductor devices are connected to one another by an interconnect structure over the semiconductor substrate. The interconnect structure may include horizontal metal lines and vertical conductive vias disposed within an inter-level dielectric (ILD) structure. Absent countermeasures, the metal of these metal lines and/or vias could diffuse outward to other parts of the IC during manufacture and/or during operation, and lead to quicker time-dependent dielectric breakdown (TDDB) of the ILD layer. To mitigate metal diffusion, barrier layer structures, such as a metal nitride, are generally disposed around outer surfaces of the metal lines and vias. In some cases, the barrier layer may also extend between neighboring metal features that are to be isolated from one another. However, the present disclosure appreciates that such a barrier layer may accumulate metal ions and/or otherwise come to potentially serve as a current leakage path between these neighboring metal features, causing reliability concerns.

Various embodiments of the present disclosure are directed towards an IC with an interconnect structure that includes a pair of neighboring metal lines that are isolated from one another. The pair of metal lines are disposed over a dielectric layer and are laterally separated from one another by a cavity. A barrier layer structure lines nearest neighboring sidewalls of the pair of metal lines, such that the outer edges of the cavity are defined by inner sidewalls of the barrier layer structure. Thus, the barrier layer structure can help limit metal of the pair of metal lines from diffusing outward into other parts of the chip during manufacturing and/or during operation, thereby improving manufacturing yield and/or long-term reliability. While the barrier layer structure extends along the nearest neighboring sidewalls of the metal lines, the barrier layer structure does not extend over the top surface of the dielectric, and thus, a lower surface of the cavity is defined by a top surface of the dielectric layer. Thus, the absence of the barrier layer structure from the top surface of the dielectric layer wards off the possibility of the barrier layer structure acting as a current leakage path in the final device. A top of the cavity is further defined by a dielectric liner extending over a top of the cavity between the inner sidewalls of the barrier layer structure. The cavity has a low dielectric constant and may, for example, be filled with air, nitrogen, oxygen, or some other suitable low dielectric constant gas. Furthermore, the low dielectric constant of the cavity reduces undesired capacitance and electric fields between the pair of metal lines. As a result, the risk of TDDB failure within the IC is mitigated.

FIG. 1 illustrates a cross-sectional view of an IC 100 in accordance with some embodiments. The IC 100 includes a semiconductor substrate 102 in which a number of semiconductor devices (not shown) are disposed. These semiconductor devices are connected to one another by an interconnect structure 103 over the semiconductor substrate 102. The interconnect structure 103 includes horizontal metal lines and vertical conductive vias that extend through an inter-level dielectric (ILD) structure to couple the semiconductor devices together. Thus, FIG. 1 includes a lower ILD layer 105 with a lower via layer 107 and lower metal layer 109; and an upper ILD layer 111 with an upper via layer 113 and an upper metal layer 115. It will be appreciated that these metal layers and via layers could correspond to any metal layer (e.g., metal0, metal1, metal2, metal3, . . . ) or any via layer (e.g., via0, via1, via2, via3), and thus, the interconnect structure of FIG. 1 is merely an example.

The lower metal layer 109 includes multiple metal lines that are electrically isolated from one another. In particular, the lower metal layer 109 includes a pair of metal lines 108, 126 with a barrier layer structure 120 extending upwards along inner sidewalls of the pair of metal lines 108, 126. The pair of metal lines 108, 126 and barrier layer structure 120 are separated by a cavity 118. The pair of metal lines 108, 126, barrier layer structure 120, and cavity 118 can be disposed over the lower dielectric layer 104, and under the upper dielectric layer 112. The barrier layer structure 120 can reduce the effects of metal diffusion between conductive features within the interconnect structure 103, thereby improving the performance and reliability of the IC 100. Further, though FIG. 1 illustrates a cavity 118 only in the lower metal layer 109 within the lower ILD layer 105, in other embodiments, other metal layers and other ILD layers (e.g., the upper ILD layer 111, and upper metal layer 115) may also include cavities analogous to cavity 118. A third metal line 134 is also separated from the metal line 126 by another cavity 136 and a barrier layer structures 138.

In some embodiments, the semiconductor substrate 102 may, for example, be or comprise bulk silicon, a silicon-on-insulator (SOI) substrate, or another suitable substrate material. The lower dielectric layer 104—which may also be referred to as a first dielectric layer in some embodiments— extends over the semiconductor substrate 102, and a first via (or contact) 114 extends from a top surface of the semiconductor substrate 102 to a top surface of the lower dielectric layer 104.

The pair of metal lines 108, 126, are disposed over the lower dielectric layer 104 and are laterally spaced apart from one another by cavity 118. One of the pair of metal lines 126 electrically couples to the first via 114. The barrier layer structure 120 extends from the dielectric layer 104 and along nearest neighboring sidewalls of the pair of metal lines 108, 126 such that the cavity 118 is defined by inner sidewalls of the barrier layer structure 120 and a top surface of the lower dielectric layer 104. In some embodiments the barrier layer structure 120 may, for example, be or comprise titanium (Ti), titanium nitride (TiN), tantalum (Ta), tantalum nitride (TaN), or other metal nitrides.

A "U" shaped dielectric liner 122 extends over a top of the cavity 118 between the inner sidewalls of the barrier layer structure 120, extending from a top surface of the cavity 118 to a top surface of the barrier layer structure 120. The dielectric liner 122 may, for example, be or comprise $SiO_2$, silicon oxycarbide (SiOC), silicon oxynitride ($SiO_xN_y$), silicon carbon nitride (SiCN), or the like. The cavity 118 may, for example, be or comprise air, nitrogen, oxygen, or some other suitable low dielectric constant gas. A dielectric cap 124 is disposed within inner sidewalls of the dielectric liner 122 and extends from a first top surface of the dielectric liner 122 to a top surface of the barrier layer structure 120. The dielectric cap 124 may, for example, be or comprise silicon based material such as $SiO_2$, silicon oxycarbide (SiOC), silicon carbonitride (SiCN), silicon nitride ($Si_3N_4$), silicon carbon oxynitride (SiCON), silicon carbide (SiC), silicon oxynitride ($SiO_xN_y$), silicon carbon nitride (SiCN), silicon oxynitride (SiON), or low-k materials such as carbon doped oxide (e.g. SiCOH) or the like with a dielectric constant between 2 and 3.6 and porosity between 0.1% and 40%. Typically, the dielectric liner 122 has a greater structural integrity than the dielectric cap 124, such that the dielectric liner 122 provides good structural integrity over the cavity 118 while the dielectric cap 124 has a lower dielectric value such that the dielectric liner 122 and dielectric cap 124 collectively provide a good balance of structural integrity and good electrical isolation (low dielectric constant).

The upper dielectric layer 112—which may also be referred to as a second dielectric layer in some embodiments—is disposed over the pair of metal lines 108, 126, barrier layer structure 120, dielectric liner 122, and dielectric cap 124. A second via 132 is disposed within the upper dielectric layer 112 and electrically couples one of the pair of metal lines 126 to an upper metal line 130. In some embodiments, the lower dielectric layer 104 and upper dielectric layer 112 may, for example, be or comprise silicon dioxide, a low-k dielectric material, an extreme low-k electric material, or the like. In some embodiments, the pair of metal lines 108, 126, first via 114, and second via 132 may, for example, be or comprise copper (Cu), ruthenium (Ru), tungsten (W), cobalt (Co), titanium (Ti), aluminum (Al), molybdenum (Mo), chromium (Cr), manganese (Mn), rhodium (Rh), iridium (Jr), nickel (Ni), lead (Pd), platinum (Pt), silver (Ag), gold (Au), or the like.

The pair of metal lines 108, 126 are separated by the cavity 118, barrier layer structure 120, and dielectric liner 122. Furthermore, the barrier layer structure 120 is separated by cavity 118, and therefore, discontinuous, and effects of the barrier layer structure 120 facilitating metal diffusion is mitigated. Additionally, there is a capacitance between the pair of metal lines 108, 126 that is dependent on the dielectric constant of the cavity 118. The low dielectric constant of the cavity 118 aids in reducing undesired capacitance and electric fields between the pair of metal lines 108, 126 preventing resistive-capacitive (RC) delays which can affect a switching speed of the IC 100. As a result, the risk of TDDB failure within the IC 100 is mitigated.

Figure 2:
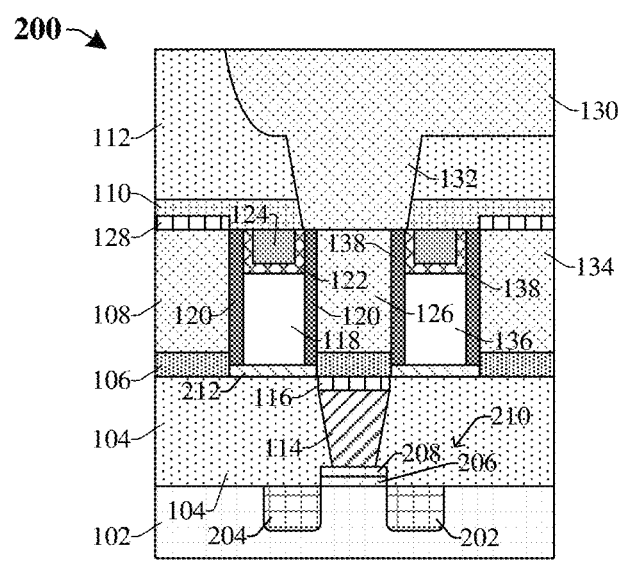
FIG. 2 illustrates a cross-sectional view of some embodiments of an integrated chip (IC) having a pair of metal lines with a barrier layer structure extending along inner sidewalls of the pair of metal lines where the pair of metal lines are separated by a cavity and a blocking layer, and where a bottom surface of the barrier layer structure is above the blocking layer.

FIG. 2 illustrates a cross-sectional view of some embodiments of an integrated chip 200 having a pair of metal lines 108, 126 with a barrier layer structure 120 extending along inner sidewalls of the pair of metal lines 108, 126, where the pair of metal lines 108, 126 are separated by a cavity 118 and a blocking layer 212, and where a bottom surface of the barrier layer structure 120 is above the blocking layer 212. Integrated chip 200 shows additional embodiments to that discussed in FIG. 1, as well as an alternative embodiment with regards to the blocking layer 212 separating the pair of metal lines 108, 126 and between the dielectric layer 104 and barrier layer structure 120.

The integrated chip 200 includes a semiconductor device 210 disposed within a semiconductor substrate 102. In some embodiments, the semiconductor device 210 comprises source/drain regions 204, 202 disposed within the semiconductor substrate 102. The semiconductor device 210 may further comprise a gate dielectric layer 206 above the semiconductor substrate 102 and between the source/drain regions 204, 202 and a gate electrode 208 overlying the gate dielectric layer 206. The gate dielectric layer 206 and gate electrode 208 are disposed within the dielectric layer 104. A first via 114 extends from the gate electrode 208 to a bottom surface of a first metal cap 116. The first metal cap 116 extends from a top surface of the first via 114 to a top surface of the dielectric layer 104.

A glue layer structure 106 and a blocking layer 212 are disposed over the dielectric layer 104 where the glue layer structure 106 are laterally spaced apart from one another by the blocking layer 212. In some embodiments the glue layer structure 106 may, for example, be or comprise titanium (Ti), titanium nitride (TiN), tantalum (Ta), tantalum nitride (TaN), or other metal nitrides. In some embodiments, the blocking layer 212 may be a continuous layer that defines the lower surface of the cavity 118, but in other embodiments, the blocking layer 212 is "blotchy" or "patchy" and is merely residue, meaning that the blocking layer 212 includes a series of patches or blotches that cover at least part, but not all, of the upper surface of the lower dielectric layer 104 to define the bottom of the cavity 118. For example, the blocking layer 212 can include patches of different shapes and size (e.g., random shapes and sizes) that cover between 10% and 90% of the surface are of the upper surface of the lower dielectric under the cavity 118 in some embodiments. In other embodiments, such as in the illustrated embodiments, the blocking layer 212 can cover 100% of the lower surface of the cavity 118; and in other embodiments the blocking layer 212 may not be present, such that lower surfaces of the barrier layer structure 120 are spaced apart from an upper surface of the dielectric layer 104 by the cavity 118.

In some embodiments, blocking layer 212 may be or comprise butyltriethoxysilane, cyclohexyltrimethoxysilane, cyclopentyltrimethoxysilane, dodecyltriethoxysilane, dodecyltrimethoxysilane, decyltriethoxysilane, dimethoxy (methyl)-n-octylsilane, triethoxyethylsilane, ethyltrimethoxysilane, hexyltrimethoxysilane, hexyltriethoxysilane, hexadecyltrimethoxysilane, hexadecyltriethoxysilane, triethoxymethylsilane, trimethoxy(methyl)silane, methoxy (dimethyl)octadecylsilane, methoxy(dimethyl)-n-octylsilane, octadecyltriethoxysilane, triethoxy-n-octylsilane, octadecyltrimethoxysilane, trimethoxy(propyl)silane, trimethoxy-n-octylsilane, triethoxy(propyl)silane, methane, ethane, propane, butane, pentane, hexane, heptane, octane, nonane, decane, undecane, dodecane, pentadecane, hexadecane, or the like.

A pair of metal lines 108, 126, are disposed over the glue layer structure 106, respectively, where outermost sidewalls of the pair of metal lines 108, 126 and outermost sidewalls of the glue layer structure 106 are aligned. In some embodiments, one of the pair of metal lines 126 is electrically coupled to the first via 114 through one of the glue layer structure 106 (e.g., middle).

A barrier layer structure 120 extends from a top surface of the blocking layer 212 along nearest neighboring sidewalls of the glue layer structure 106, nearest neighboring sidewalls of the pair of metal lines 108, 126, and laterally separated by cavity 118. The cavity 118 is defined by inner sidewalls of the barrier layer structure 120 and a top surface of the blocking layer 212. In some embodiments, the blocking layer 212 can be discontinuous in the lateral direction where the cavity 118 can extend between one or more portions of the blocking layer 212 that can be discontinuous, down to a top surface of the dielectric layer 104 (not shown).

A dielectric liner 122 extends over a top of the cavity 118 between the inner sidewalls of the barrier layer structure 120. The dielectric liner 122 includes a dielectric liner lower portion that extends laterally over the top of the cavity 118 and a pair of dielectric liner upper sections that extend along the inner sidewalls of the barrier layer structure 120 to a top surface of the barrier layer structure 120. A dielectric cap 124 is disposed within inner sidewalls of the dielectric liner 122 and extends from a first top surface of the dielectric liner 122 to a top surface of the barrier layer structure 120.

One or more second metal caps 128 are disposed over one or more of the pair of metal lines 108, 126. The one or more second metal caps 128 extend laterally between sidewalls of the one or more of the pair of metal lines 108, 126. In some embodiments, the first metal cap 116 and one or more second metal caps 128 may, for example, be or comprise copper (Cu), ruthenium (Ru), tungsten (W), cobalt (Co), titanium (Ti), aluminum (Al), molybdenum (Mo), chromium (Cr), manganese (Mn), rhodium (Rh), iridium (Jr), nickel (Ni), lead (Pd), platinum (Pt), silver (Ag), gold (Au), or the like.

A second via 132 is disposed within an etch stop layer 110 and second dielectric layer 112, and couples the metal line 126 to an upper metal line 130. The etch stop layer 110 overlies the one or more second metal caps 128, a top surface of the barrier layer structure 120, the dielectric liner 122, and dielectric cap 124. The second dielectric layer 112 overlies the etch stop layer 110. In some embodiments, the etch stop layer 110 may, for example, be or comprise a nitride, such as silicon nitride, or the like.

Figure 3:
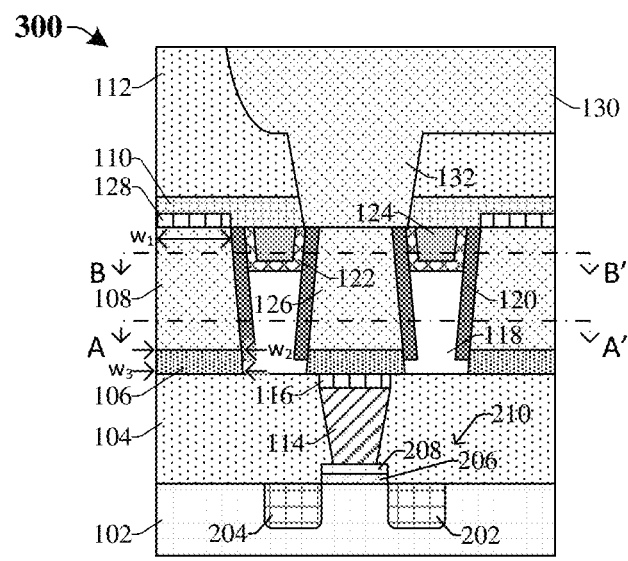
FIG. 3 illustrates a cross-sectional view of some embodiments of an integrated chip having an alternative profile for the pair of metal lines, glue layer structure, barrier layer structure, cavity, dielectric liner, and dielectric cap.

FIG. 3 illustrates a cross-sectional view of some embodiments of an integrated chip 300 having an alternative profile for the pair of metal lines 108, 126, glue layer structure 106, barrier layer structure 120, cavity 118, dielectric liner 122, and dielectric cap 124. Integrated chip 300 shares the same description for all of the embodiments described in FIG. 2 except for the pair of metal lines 108, 126, glue layer structure 106, barrier layer structure 120, cavity 118, dielectric liner 122, and dielectric cap 124.

The integrated chip 300 includes a glue layer structure 106 disposed over the dielectric layer 104 where the glue layer structure 106 are laterally spaced apart from one another by a cavity 118. A pair of metal lines 108, 126 are disposed over the glue layer structure 106 where outermost sidewalls of the pair of metal lines 108, 126 and outermost sidewalls of the glue layer structure 106 are aligned. A top of the pair of metal lines 108, 126 has a first width, $w_1$, and a bottom of the pair of metal lines 108, 126 has a second width, $w_2$, that is wider than the first width, $w_1$. A top of the glue layer structure 106 has a second width, $w_2$, and a bottom of the glue layer structure 106 has a third width, $w_3$, that is wider than the second width, $w_2$. As such, nearest neighboring sidewalls of the pair of metal lines 108, 126 and glue layer structure 106 are angled with respect to one another such that the bottom of the nearest neighboring sidewalls are closer to one another than a top of the nearest neighboring sidewalls. A profile of the nearest neighboring sidewalls of the pair of metal lines 108, 126 and glue layer structure 106 can be at an angle of 70 degrees to 90 degrees with respect to the dielectric layer 104.

A barrier layer structure 120 extends along nearest neighboring sidewalls of the glue layer structure 106, and nearest neighboring sidewalls of the pair of metal lines 108, 126, from a top surface of the pair of metal lines 108, 126 to above a top surface of the dielectric layer 104. A bottom surface of the barrier layer structure 120 is separated from the top surface of the dielectric layer 104 by the cavity 118, where the cavity 118 is defined by a top surface of the dielectric layer 104, and the bottom surface and inner sidewalls of the barrier layer structure 120. Sidewalls of the barrier layer structure 120 are angled to match the profile of the nearest neighboring sidewalls of the pair of metal lines.

Figure 4:
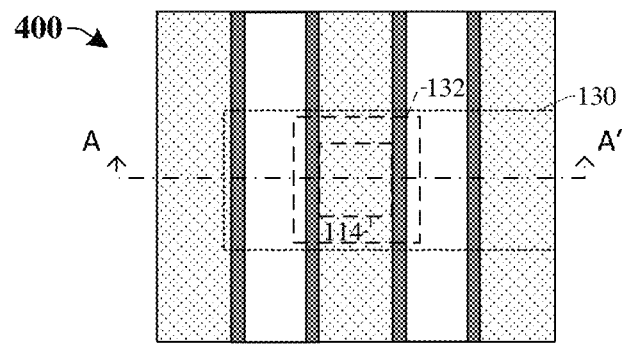
FIG. 4 illustrates a top view of cut A to A' from FIG. 3.

FIG. 4 illustrates a top view 400 of cut A to A' from FIG. 3. Top view 400 shows the pair of metal lines 108, 126 laterally separated by the barrier layer structure 120 and cavity 118 where the barrier layer structure 120 and cavity 118 extend along a path created by the pair of metal lines 108, 126.

The integrated chip 300 further includes a dielectric liner 122 that extends over a top of the cavity 118 between inner sidewalls of the barrier layer structure 120. The dielectric liner 122 includes a dielectric liner lower portion that extends laterally over the top of the cavity 118 and a pair of dielectric liner upper sections that extend along the inner sidewalls of the barrier layer structure 120 to a top surface of the barrier layer structure 120. The bottom surface of the dielectric liner 122 is above a top surface of the glue layer structure 106. A dielectric cap 124 is disposed within inner sidewalls of the dielectric liner 122 and extends from a first top surface of the dielectric liner 122 to a top surface of the barrier layer structure 120. Sidewalls of the dielectric liner 122 and dielectric cap 124 are angled to match the profile of the nearest neighboring sidewalls of the pair of metal lines 108, 126.

Figure 5:
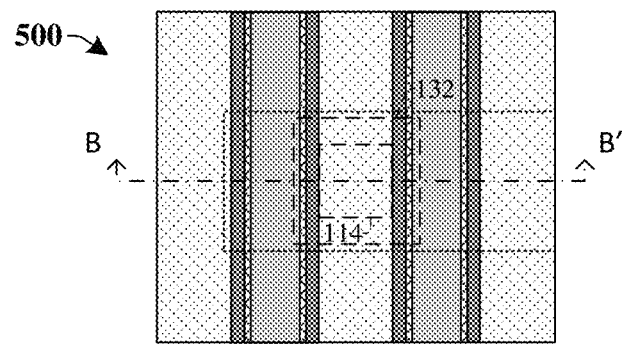
FIG. 5 illustrates a top view of cut B to B' from FIG. 3.

FIG. 5 illustrates a top view 500 of cut B to B' from FIG. 3. Top view 500 shows the pair of metal lines 108, 126 laterally separated by the barrier layer structure 120, dielectric liner 122, and dielectric cap 124 where the barrier layer structure 120, dielectric liner 122, and dielectric cap 124 extend along a path created by the pair of metal lines 108, 126.

It can be appreciated that the barrier layer structure 120, cavity 118, pair of metal lines 108, 126, glue layer structure 106, dielectric liner 122, and dielectric cap 124 can take the form described in FIGS. 1-3 relative to the rest of the ICs 100, 200, and 300, in any combination thereof.

FIGS. 6-19 illustrate cross-sectional views of some embodiments of a method of forming an integrated chip having a metal lines 108, 126 with a barrier layer structures 120 extending along inner sidewalls of the metal lines 108, 126, where the metal lines 108, 126 and barrier layer structures 120 are separated by cavities 118. Although the cross-sectional views 600-1900 shown in FIGS. 6-19 are described with reference to a method, it will be appreciated that the structures shown in FIGS. 6-19 are not limited to the method but rather may stand alone separate of the method. Furthermore, although FIGS. 6-19 are described as a series of acts, it will be appreciated that these acts are not limited in that the order of the acts can be altered in other embodiments, and the methods disclosed are also applicable to other structures. In other embodiments, some acts that are illustrated and/or described may be omitted in whole or in part. Also, alternative embodiments depicted in FIGS. 1-5 may be substituted for embodiments in FIGS. 6-19 although they may not be shown.

Figure 6:
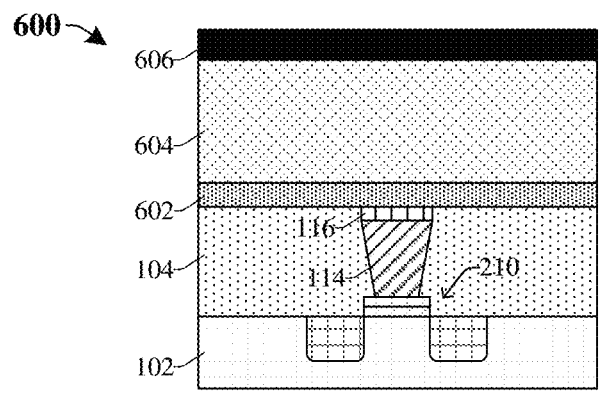
FIGS. 6-19 illustrate cross-sectional views of some embodiments of a method of forming an integrated chip having a metal lines with a barrier layer structures extending along inner sidewalls of the metal lines where the metal lines and barrier layer structures are separated by cavities.

A shown in cross-sectional view 600 of FIG. 6, a first via 114 is formed over a semiconductor device 210 within a dielectric layer 104. A first metal cap 116 is formed over the first via within the dielectric layer 104.

In some embodiments, a single damascene process for forming the first via 114 may include: depositing (e.g., by chemical vapor deposition (CVD), physical vapor deposition (PVD), atomic layer deposition (ALD), etc.) the dielectric layer 104 over a semiconductor substrate 102. The dielectric layer 104 is patterned to define a lower conductive feature opening within the dielectric layer 104. A conductive material is deposited (e.g., by PVD, CVD, ALD, etc.) within the lower conductive feature opening. Furthermore, by another deposition process (e.g. by PVD, CVD, ALD, etc.), the first metal cap 116 is deposited to a thickness ranging between 2 to 50 angstroms over the first via 114, and a planarization process (e.g., a chemical mechanical planarization (CMP) process) is performed such that the first metal cap 116 extends from a top surface of the first via 114 to a top surface of the dielectric layer 104.

A glue layer 602 is deposited over the dielectric layer 104 and the first metal cap 116. In some embodiments the glue layer 602 may, for example, be deposited by PVD, CVD, ALD, or another suitable growth or deposition process to a thickness ranging between 2 to 100 angstroms. In some embodiments the glue layer 602 may, for example, be or comprise titanium (Ti), titanium nitride (TiN), tantalum (Ta), tantalum nitride (TaN), or other metal nitrides. A metal layer 604 is deposited over the glue layer 602. In some embodiments the metal layer 604 may, for example, be deposited by PVD, CVD or ALD another suitable growth or deposition process. In some embodiments the first via 114 and metal layer 604 thickness may range between 50 to 500 angstroms. A hard mask layer 606 is deposited over the metal layer 604. In some embodiments, the hard mask layer 606 may, for example, be deposited by a PVD, CVD or ALD and may be or comprise a silicon based material, such as silicon nitride for example.

Figure 7:
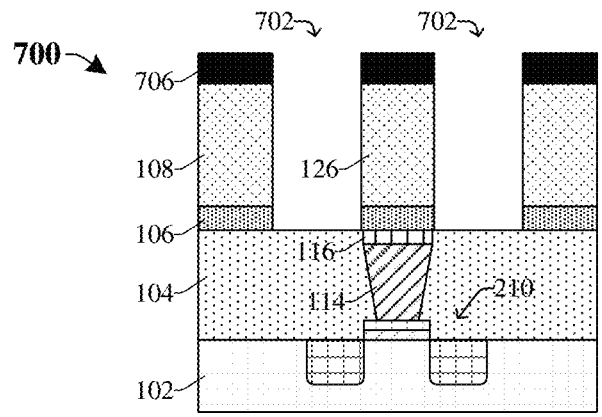

As shown in cross-sectional view 700 of FIG. 7, a patterning process is performed on the glue layer (602 of FIG. 6), metal layer (604 of FIG. 6), and hard mask layer (606 of FIG. 6), thereby forming cavity openings 702, glue layer structures 106, metal lines 108, 126, and hard mask caps 706 and exposing a top surface of the dielectric layer 104; and sidewalls of metal lines 108, 126, glue layer structures 106, and cavity openings 702. The patterning may, for example, comprise any of a photolithography process and an etching process. In some embodiments (not shown), a photoresist is formed over the glue layer (602 of FIG. 6). The photoresist is patterned by an acceptable photolithography technique to develop an exposed photo resist. With the exposed photo resist in place, an etch is performed to transfer the pattern from the exposed photo resist to the underlying layers, for example, the glue layer (602 of FIG. 6), metal layer (604 of FIG. 6), and hard mask layer (606 of FIG. 6), to define cavity openings 702. The etching process may comprise a wet etching process, a dry etching process, or some other suitable etching process.

Figure 8:
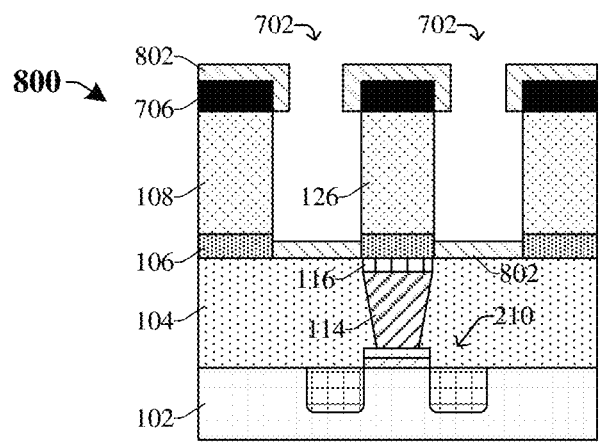

As shown in cross-sectional view 800 of FIG. 8, a blocking layer 802 is selectively deposited on the top surface and sidewalls of hard mask caps 706, and further selectively deposited on the top surface of the dielectric layer 104 exposed through cavity openings 702, but does not form on surfaces of the metal lines 108, 126. In some embodiments, the blocking layer 802 may, for example, be or comprise butyltriethoxysilane, cyclohexyltrimethoxysilane, cyclopentyltrimethoxysilane, dodecyltriethoxysilane, dodecyltrimethoxysilane, decyltriethoxysilane, dimethoxy(methyl)-n-octylsilane, triethoxyethylsilane, ethyltrimethoxysilane, hexyltrimethoxysilane, hexyltriethoxysilane, hexadecyltrimethoxysilane, hexadecyltriethoxysilane, triethoxymethylsilane, trimethoxy(methyl)silane, methoxy(dimethyl)octadecylsilane, methoxy(dimethyl)-n-octylsilane, octadecyltriethoxysilane, triethoxy-n-octylsilane, octadecyltrimethoxysilane, trimethoxy(propyl)silane, trimethoxy-n-octylsilane, triethoxy(propyl)silane, methane, ethane, propane, butane, pentane, hexane, heptane, octane, nonane, decane, undecane, dodecane, pentadecane, hexadecane, or the like. The blocking layer 802 may selectively bond to silicon-based material surfaces such as SiO2, Si3N4, SiCN, SiCO, SiCON, SiON, or the like, for example, hard mask caps 706 and dielectric layer 104. The selective bonding process may include a surface treatment process and be performed by CVD, ALD, a spin-on process, a dipping process, or reaction through remote plasma processes, to a thickness range between 2 to 50 angstroms.

Figure 9:
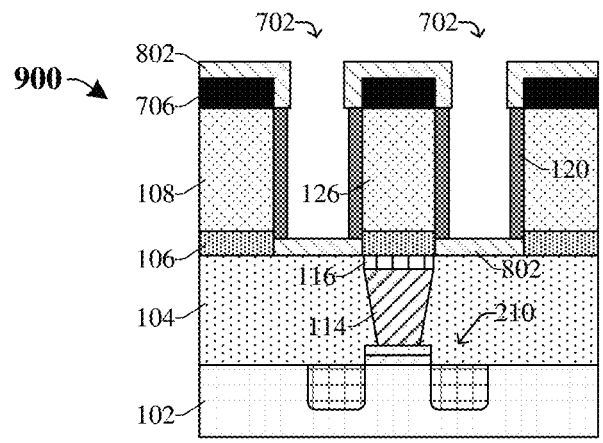

As shown in cross-sectional view 900 of FIG. 9, barrier layer structures 120 are selectively deposited along exposed and nearest neighboring sidewalls of metal lines 108, 126 and glue layer structures 106 between a top surface of blocking layer 802 (e.g., the blocking layer 802 deposited on the top surface of dielectric layer 104), and a bottom surface of blocking layer 802 (e.g., the blocking layer 802 deposited on the sidewalls of hard mask caps 706). The barrier layer structures 120 are selectively deposited such that cavity openings 702 laterally separate sidewalls of barrier layer structures 120. In some embodiments, the barrier layer structures may comprise TaN or TiN, for example, and may be selectively deposited by a PVD, CVD, ALD process, or the like, to a thickness range between 2 to 100 angstroms.

Figure 10:
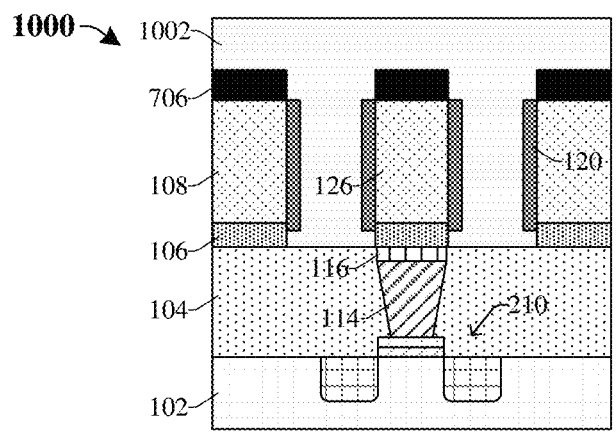

As shown in cross-sectional view 1000 of FIG. 10, the blocking layer (802 of FIG. 9) is removed and cavity openings (702 of FIG. 9) are filled with a thermal degradable polymer 1002. In some embodiments, blocking layer (802 of FIG. 9) may, for example, be removed through a chemical wash process, or other removal process. Removal of blocking layer (802 of FIG. 9) exposes a top surface and sidewalls of hard mask caps 706, a top and bottom surface of the barrier layer structures 120, sidewalls of glue layer structures 106, and top surface of dielectric layer 104 inside of cavity openings (702 of FIG. 9) (not shown). In some embodiments there may be a gap with a thickness of 0.5 to 3 nanometers between the bottom surface of the barrier layer structures 120 and a top surface of the dielectric layer 104. In some embodiments, the blocking layer (802 of FIG. 9) between the dielectric layer 104 and barrier layer structures 120 may not be removed, or blocking layer (802 of FIG. 9) may not be fully removed and some blocking layer (802 of FIG. 9) material may remain under barrier layer structures 120, sidewalls of glue layer structures 106, and top surface of dielectric layer 104 as described in FIG. 2. In some embodiments, the remaining blocking layer (802 of FIG. 9) between the dielectric layer 104 and barrier layer structures 120 may be a thickness range of 0.5 to 3 nanometers.

The thermal degradable polymer 1002 is deposited in cavity openings (702 of FIG. 9) over a top surface of dielectric layer 104, sidewalls of glue layer structures 106, bottom surfaces, sidewalls, and top surfaces of barrier layer structures 120, and sidewalls and top surfaces of hard mask caps 706. In some embodiments, the thermal degradable polymer 1002 may, for example, be or comprise an organic compound composed of carbon, oxygen, nitrogen, and hydrogen, or other organic material. In some embodiments, the thermal degradable polymer 1002 may, for example, be deposited by CVD, ALD, plasma-enhanced CVD (PECVD), plasma-enhanced ALD (PEALD), molecular layer deposition (MLD), a spin-on process, or the like, to a thickness range of 2 to 1000 angstroms.

Figure 11:
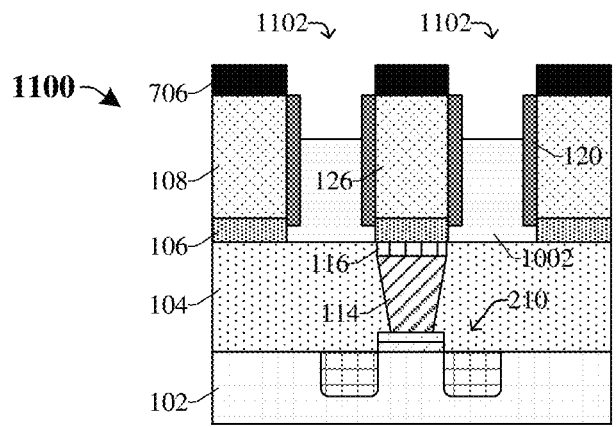

As shown in cross-sectional view 1100 of FIG. 11, a height of the thermal degradable polymer 1002 is reduced to being between the top surface and the bottom surface of the barrier layer structures 120 thereby exposing a top surface and sidewalls of hard mask caps 706, and a top surface and sidewalls of barrier layer structures 120. In some embodiments, the height of deposition of the thermal degradable polymer 1002 may be controlled by a thermal recess process, or an etch back process through one or more of thermal baking and ultraviolet (UV) curing. After the height of the thermal degradable polymer 1002 is reduced, recesses 1102 are created between nearest neighboring sidewalls of barrier layer structures 120 and hard mask caps 706.

Figure 12:
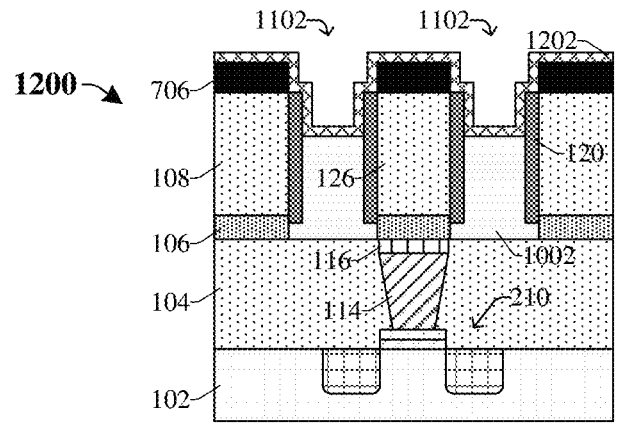

As shown in cross-sectional view 1200 of FIG. 12, a dielectric liner layer 1202 is deposited along top surfaces and sidewalls of the hard mask caps 706, top surfaces and sidewalls of barrier layer structures 120, and top surfaces of the thermal degradable polymer 1002 in recesses 1102. In some embodiments, the dielectric liner layer 1202 may, for example, be or comprise porous SiO2, SiOC, SiON, SiCN, SiCON, or the like. In some embodiments, the dielectric liner layer 1202 may, for example, be deposited by a PVD, CVD, ALD, PECVD, PEALD process, or other suitable process, to a thickness range between 2 to 100 angstroms.

Figure 13:
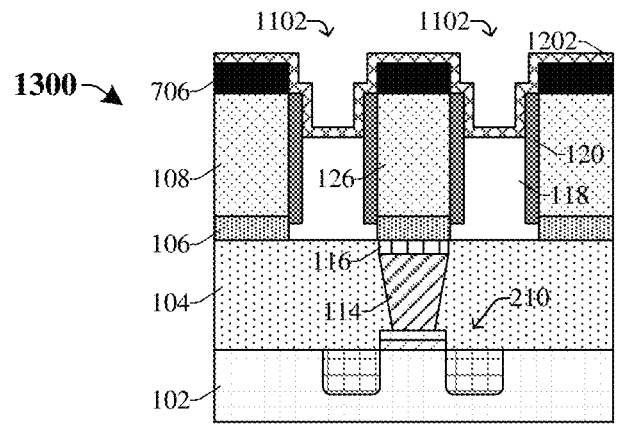

As shown in cross-sectional view 1300 of FIG. 13, the thermal degradable polymer (1002 of FIG. 12) is removed. In some embodiments, the thermal degradable polymer (1002 of FIG. 12) may, for example, be removed by means of a burn out process that may include one or more of thermal baking or a UV curing process, or other thermal process, that would include the thermal degradable polymer (1002 of FIG. 12) being removed through the dielectric liner layer 1202 that is porous. After removal of the thermal degradable polymer (1002 of FIG. 12), cavities 118 are defined by a top surface of the dielectric layer 104, sidewalls of glue layer structures 106, a bottom surface and sidewalls of barrier layer structures 120, and a bottom surface of the dielectric liner layer 1202.

Figure 14:
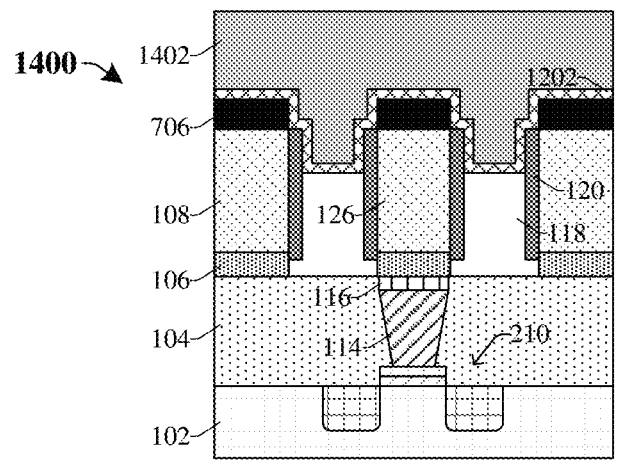

As shown in cross-sectional view 1400 of FIG. 14, a dielectric capping layer 1402 is deposited over a top surface of the dielectric liner layer 1202. In some embodiments, the dielectric capping layer 1402 may, for example, be or comprise a silicon-based material such as SiOC, SiCN, $Si_3N_4$, SiCON, SiO2, SiC, SiON, or low-k materials such as carbon doped oxide (e.g. SiCOH) or the like with a dielectric constant between 2 and 3.6 and porosity between 0.1% and 40%. In some embodiments, the dielectric capping layer 1402 may, for example, be deposited by CVD, ALD, PECVD, PEALD, or another suitable deposition process to a thickness range of 2 to 1000 angstroms.

Figure 15:
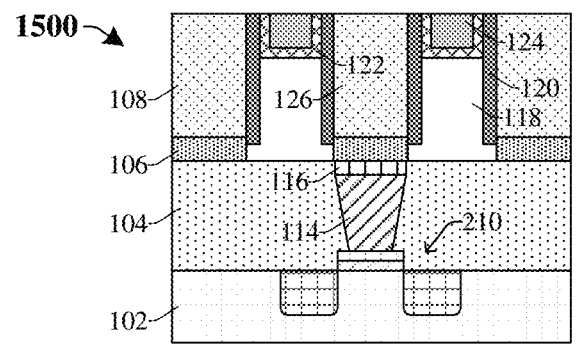

As shown in cross-sectional view 1500 of FIG. 15, hard mask caps (706 of FIG. 14), dielectric liner layer (1202 of FIG. 14), and dielectric capping layer (1402 of FIG. 14) are planarized to form dielectric liners 122 and dielectric caps 124. In some embodiments, hard mask caps (706 of FIG. 14), dielectric liner layer (1202 of FIG. 14), and dielectric capping layer (1402 of FIG. 14) may, for example, be planarized through a CMP process, or other suitable removal process. Dielectric liners 122 and dielectric caps 124 are formed such that top surfaces of dielectric liners 122 and dielectric caps 124 are at a top surfaces of metal lines 108, 126.

Figure 16:
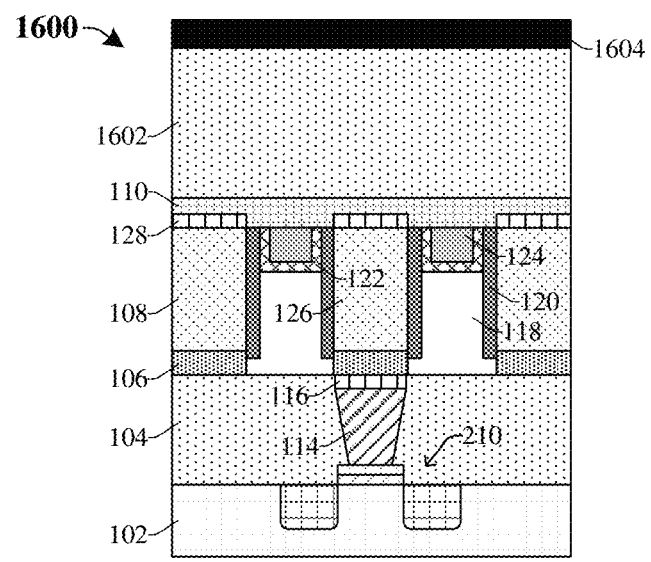
Figure 17:
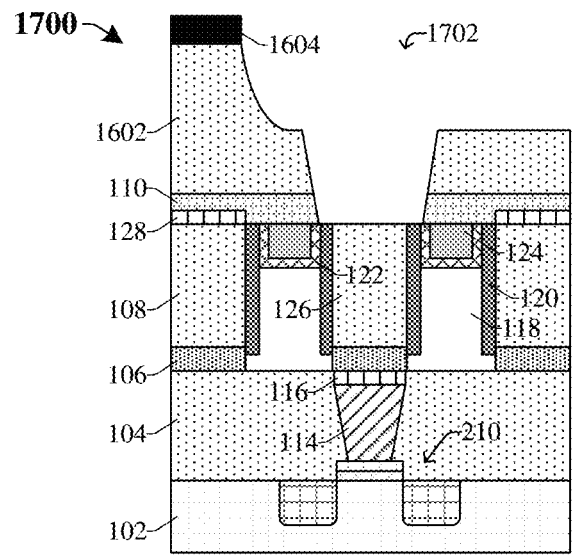
Figure 18:
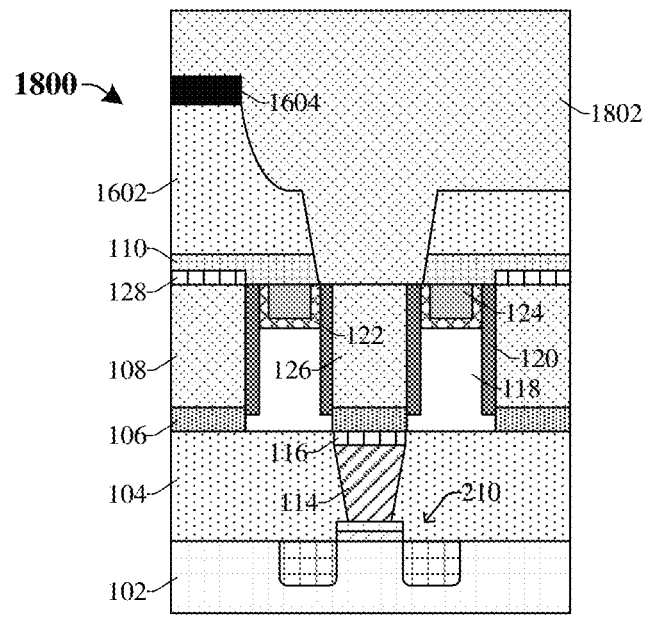

As shown in cross-sectional view 1600 of FIG. 16, second metal caps 128 are formed by depositing a metal capping layer (not shown) over the metal lines 108, 126, barrier layer structures 120, dielectric liners 122, and dielectric caps 124, and patterning the metal capping layer. An etch stop layer 110 is deposited over the second metal caps, barrier layer structures 120, dielectric liners 122, and dielectric caps 124. A second dielectric layer 1602 is deposited over the etch stop layer 110, and a hard mask layer 1604 is deposited over the second dielectric layer 1602. In some embodiments, the metal capping layer, etch stop layer 110, second dielectric layer 1602, and hard mask layer 1604 may, for example, be deposited by a CVD, ALD, PVD or other suitable deposition process. In some embodiments, second metal caps 128 may, for example, be formed by a wet etch, a dry etch, or other suitable etching process. In some embodiments, the etch stop layer 110 may, for example, be or comprise a nitride (e.g., silicon nitride), a carbide (e.g., silicon carbide), or the like. In some embodiments, the hard mask layer 1604 may, for example, be or comprise a silicon-based material.

As shown in cross-sectional view 1700, the hard mask layer 1604, the second dielectric layer 1602, etch stop layer 110, and second metal cap 128 (middle) are patterned. Thus, sidewalls of the hard mask layer 1604, second dielectric layer 1602, and etch stop layer 110 are exposed. A top surface of metal line 126 and barrier layer structures 120 (middle two along sidewalls of metal line 126) are also exposed thereby forming opening 1702.

As shown in cross-sectional view 1800, opening 1702 is filled with a top metal layer 1802 by deposition. Top metal layer 1802 is deposited along a top surface of metal line 126 and barrier layer structures 120 (middle two along sidewalls of metal line 126); sidewalls of the etch stop layer 110, second dielectric layer 1602, and hard mask layer 1604; and top surfaces of hard mask layer 1604, and second dielectric layer 1602. In some embodiments, the top metal layer 1802 may, for example, be deposited by PVD, CVD, ALD, or another suitable deposition process. In some embodiments, the top metal layer 1802 may, for example, be or comprise copper (Cu), ruthenium (Ru), tungsten (W), cobalt (Co), titanium (Ti), aluminum (Al), molybdenum (Mo), chromium (Cr), manganese (Mn), rhodium (Rh), iridium (Ir), nickel (Ni), lead (Pd), platinum (Pt), silver (Ag), gold (Au), or the like.

Figure 19:
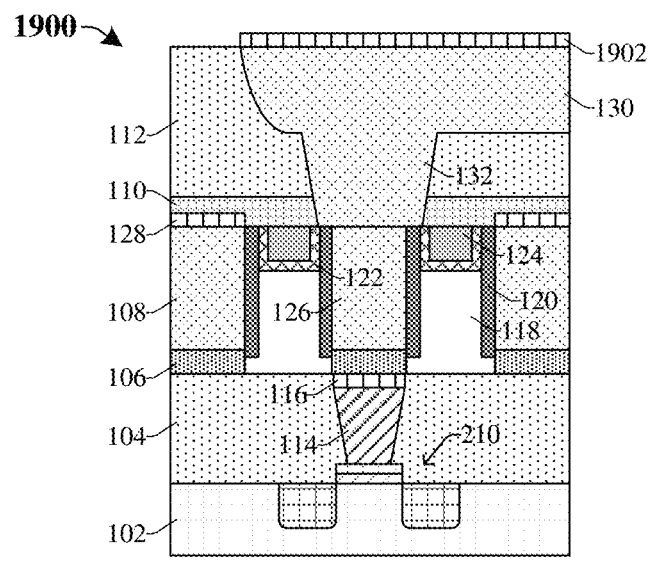

As shown in cross-sectional view 1900 of FIG. 19 the second dielectric layer 112, second via 132, and an upper metal line 130 are formed by a planarization through a CMP process, or other suitable removal process. A third capping layer 1902 can be deposited along a top surface and between sidewalls of the upper metal line 130 by CVD, ALD, a spin-on process, or other suitable deposition process.

Figure 20:
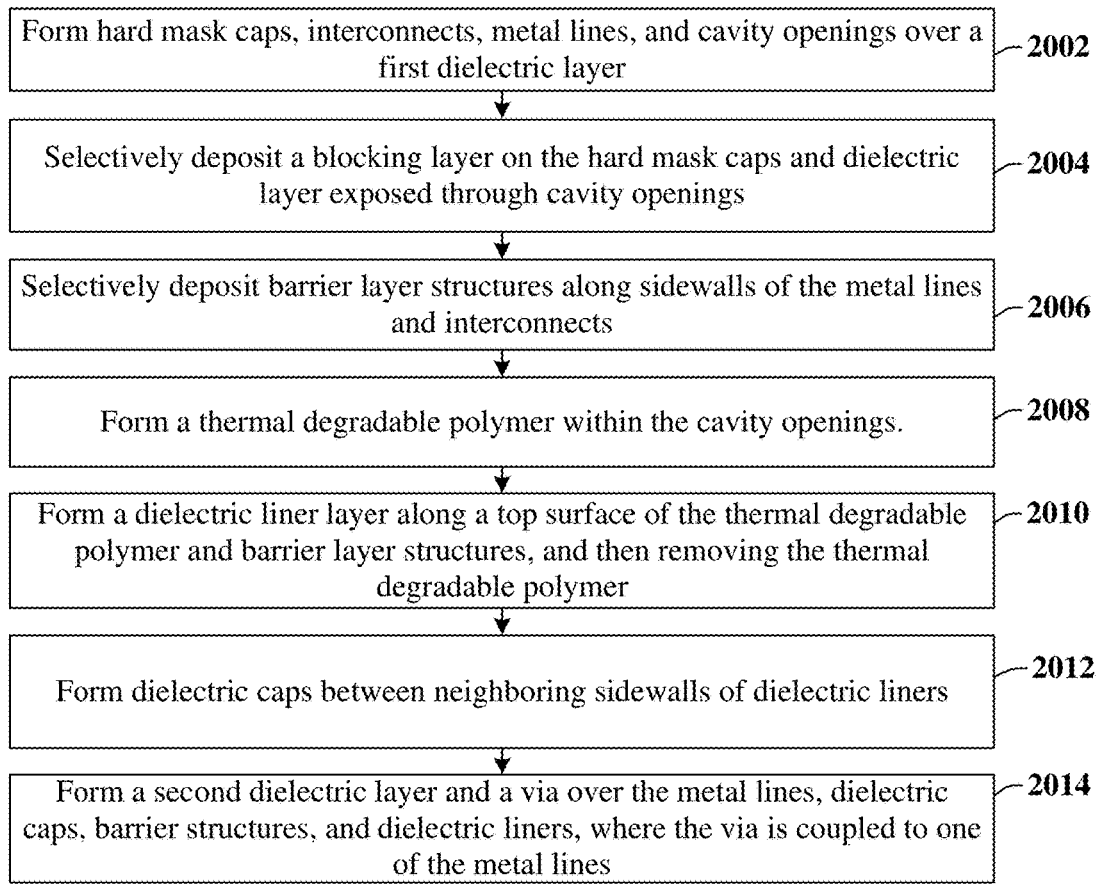
FIG. 20 illustrates a flow diagram of some embodiments of a method of forming an integrated chip having a pair of metal lines with a barrier layer structure extending along inner sidewalls of the pair of metal lines where the pair of metal lines and barrier layer structure are separated by a cavity.

FIG. 20 illustrates a flow diagram of some embodiments of a method 2000 of forming an integrated chip having a pair of metal lines 108, 126 with a barrier layer structure 120 extending along inner sidewalls of the pair of metal lines 108, 126, where the pair of metal lines 108, 126 and barrier layer structure 120 are separated by a cavity 118. Although the method 2000 is illustrated and/or described as a series of acts or events, it will be appreciated that the method 2000 is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 2002, hard mask caps, glue layer structures, metal lines, and cavity openings are formed over a first dielectric layer. FIGS. 6 and 7 illustrate cross-sectional views 600 and 700 respectively corresponding to some embodiments of act 2002.

At act 2004, a blocking layer is selectively deposited on the top surface and sidewalls of the hard mask caps, and further selectively deposited on the top surface of the first dielectric layer exposed through the cavity openings. FIG. 8 illustrates cross-sectional view 800 corresponding to some embodiments of act 2004.

At act 2006, barrier layer structures are selectively deposited along sidewalls of the metal lines and glue layer structures between a top surface of the blocking layer, and a bottom surface of the blocking layer. The barrier layer structures are selectively deposited such that the cavity openings laterally separate sidewalls of the barrier layer structures. FIG. 9 illustrates cross-sectional view 900 corresponding to some embodiments of act 2006.

At act 2008, a thermal degradable polymer is formed within the cavity openings. FIGS. 10 and 11 illustrate cross-sectional views 1000 and 1100 corresponding to some embodiments of act 2008.

At act 2010, a dielectric liner layer is formed along a top surface of the thermal degradable polymer and a top surface of the barrier layer structures and then the thermal degradable polymer is removed creating a cavity defined by the dielectric liner layer, barrier layer structures, and first dielectric layer. FIGS. 12 and 13 illustrate cross-sectional views 1200 and 1300 corresponding to some embodiments of act 2010.

At act 2012, dielectric caps are formed between neighboring sidewalls of dielectric liners by forming a dielectric capping layer over the dielectric liner layer, and removing portions of the dielectric capping layer and dielectric liner layer. FIGS. 14 and 15 illustrate cross-sectional views 1400 and 1500 corresponding to some embodiments of act 2012.

At act 2014, a second first dielectric layer and a via are formed over the metal lines, dielectric caps, barrier structures, and dielectric liners where the via is coupled to one of the metal lines. FIGS. 16 through 19 illustrate cross-sectional views 1600 through 1900 corresponding to some embodiments of act 2014.

In various embodiments, the present application provides an integrated chip including a semiconductor substrate; a dielectric layer disposed over the semiconductor substrate; a pair of metal lines disposed over the dielectric layer and laterally spaced apart from one another by a cavity; a barrier layer structure extending along nearest neighboring sidewalls of the pair of metal lines such that the cavity is defined by inner sidewalls of the barrier layer structure and a top surface of the dielectric layer.

In various embodiments, the present application provides a semiconductor structure including a semiconductor substrate; a dielectric layer disposed over the semiconductor substrate; a first via disposed within the dielectric layer extending from the semiconductor substrate to a bottom surface of a first metal cap, the first metal cap extends from a top surface of the first via to a top surface of the dielectric layer; a glue layer structure disposed over the first metal cap; a metal line extending from the glue layer structure to a second via; a first pair of barrier layer structures disposed along sidewalls of the glue layer structure and metal line from above the dielectric layer to the top of the metal line; and a second pair of barrier layer structures separated from the first pair of barrier layer structures by a pair of cavities, the pair of cavities are along a top surface of the dielectric layer and inner sidewalls of the second pair of barrier layer structures and outer sidewalls of the first pair of barrier layer structures.

In various embodiments, the present application provides a method of forming a semiconductor device including forming a dielectric layer over a semiconductor substrate; forming a metal layer above the dielectric layer; forming a hard mask layer over the metal layer; patterning the metal layer and hard mask layer to expose a top surface of the dielectric layer and define a pair of metal lines laterally separated from one another; forming a blocking structure along the top surface of the dielectric layer, and along a top surface and sidewalls of the hard mask layer while leaving inner sidewalls of the pair of metal lines exposed; while the blocking structure is present, selectively forming a barrier layer structure along the inner sidewalls of the pair of metal lines; and removing the blocking structure to form a cavity defined by the top surface of the dielectric layer and inner sidewalls of the barrier layer structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
   a semiconductor substrate;
   a dielectric layer disposed over the semiconductor substrate;
   a pair of metal lines disposed over an upper surface of the dielectric layer and laterally spaced apart from one another by a cavity, wherein the pair of metal lines have bottom surfaces that are co-planar with the upper surface of the dielectric layer, and a bottom extent of the cavity between the pair of metal lines is defined by the upper surface of the dielectric layer; and
   a barrier layer structure extending only along nearest neighboring sidewalls of the pair of metal lines such that lateral extents of the cavity are defined by inner sidewalls of the barrier layer structure.

2. The integrated chip of claim 1, wherein the inner sidewalls of the barrier layer structure directly contact the dielectric layer.

3. The integrated chip of claim 1, further comprising:
   a dielectric liner wherein the dielectric liner is U shaped and extends over a top of the cavity between the inner sidewalls of the barrier layer structure; and
   a dielectric cap disposed within inner sidewalls of the dielectric liner and extending from a first top surface of the dielectric liner to a top surface of the barrier layer structure.

4. The integrated chip of claim 3, wherein a glue layer structure extends from a top surface of the dielectric layer and along outer sidewalls of the barrier layer structure to the pair of metal lines; and
   the pair of metal lines extend to the top surface of the barrier layer structure.

5. The integrated chip of claim 4, wherein a bottom surface of the dielectric liner is above a top surface of the glue layer structure.

6. The integrated chip of claim 1, further comprising a via, wherein the via is disposed within the dielectric layer and extends from one of the pair of metal lines, wherein the barrier layer structure does not extend into the dielectric layer and does not extend along sidewalls of the via.

7. A semiconductor structure, comprising:
   a semiconductor substrate;
   a dielectric layer disposed over the semiconductor substrate;
   a first via disposed within the dielectric layer extending from the semiconductor substrate to a bottom surface of a first metal cap, wherein the first metal cap extends from a top surface of the first via to a top surface of the dielectric layer;
   a glue layer structure disposed over the first metal cap;
   a metal line extending from the glue layer structure to a second via;
   a first pair of barrier layer structures disposed along sidewalls of the glue layer structure and metal line from above the dielectric layer to a top surface of the metal line; and
   a second pair of barrier layer structures separated from the first pair of barrier layer structures by a pair of cavities, wherein the pair of cavities are along a top surface of the dielectric layer and inner sidewalls of the second pair of barrier layer structures and outer sidewalls of the first pair of barrier layer structures.

8. The semiconductor structure of claim 7, wherein bottom surfaces of the first and second pair of barrier layer structures directly contact the dielectric layer.

9. The semiconductor structure of claim 7, wherein a bottom surface of the first and second pair of barrier layer structures are vertically separated from the top surface of the dielectric layer.

10. The semiconductor structure of claim 7, wherein a pair of dielectric liners are disposed over the pair of cavities and between the first pair and second pair of barrier layer structures, extending to a top surface of the first and second pair of barrier layer structures.

11. The semiconductor structure of claim 10, wherein the pair of dielectric liners individually comprise a first upper surface and a second upper surface below the first upper surface, and wherein the second upper surface is between inner sidewalls of the pair of dielectric liners.

12. The semiconductor structure of claim 11, wherein a dielectric cap extends from the second upper surface to the first upper surface of the pair of dielectric liners.

13. The semiconductor structure of claim 11, wherein a top surface of the glue layer structure is below a bottom surface of the pair of dielectric liners.

14. The semiconductor structure of claim 7, wherein a pair of glue layer structures are disposed over the dielectric layer and extend along outer sidewalls of the second pair of barrier layer structures to a bottom surface of a pair of metal lines; and
   the pair of metal lines extend from a top surface of the pair of glue layer structures and along outer sidewalls of the second pair of barrier layer structures to a top surface of the second pair of barrier layer structures.

15. A method of forming a semiconductor device, comprising:
   forming a dielectric layer over a semiconductor substrate;
   forming a metal layer above the dielectric layer;
   forming a hard mask layer over the metal layer;
   patterning the metal layer and hard mask layer to expose a top surface of the dielectric layer and define a pair of metal lines laterally separated from one another;
   forming a blocking structure along the top surface of the dielectric layer, and along a top surface and sidewalls of the hard mask layer while leaving inner sidewalls of the pair of metal lines exposed;
   while the blocking structure is present, selectively forming a barrier layer structure along the inner sidewalls of the pair of metal lines; and removing the blocking structure to form a cavity defined by the top surface of the dielectric layer and inner sidewalls of the barrier layer structure.

16. The method of claim 15, further comprising:
prior to forming the metal layer, forming a glue layer structure over the dielectric layer, such that the metal layer is subsequently formed over the glue layer structure and the glue layer structure is patterned with the metal layer and hard mask layer.

17. The method of claim 15, wherein the removing of the blocking structure forms a gap between the dielectric layer and a bottom surface of the barrier layer structure.

18. The method of claim 15, wherein the blocking structure is only partially removed from the top surface of the dielectric layer.

19. The method of claim 15, further comprising:
forming a thermal degradable polymer in the cavity recessed below a top surface of the barrier layer structure;
forming a second dielectric layer on an upper surface of the thermal degradable polymer, sidewalls of the barrier layer structure, and an upper surface of the barrier layer structure; and
removing the thermal degradable polymer after the second dielectric layer is formed, such that the cavity is further defined by a bottom surface of the second dielectric layer.

20. The method of claim 19, further comprising:
forming a third dielectric layer along the upper surface and sidewalls of the second dielectric layer.

* * * * *